United States Patent
Sun et al.

(10) Patent No.: US 11,441,050 B2
(45) Date of Patent: Sep. 13, 2022

(54) ELECTROMAGNETIC SHIELDING FILLER, ELECTROMAGNETIC SHIELDING COATING COMPRISING THE SAME, PREPARATION METHOD AND USE THEREOF

(71) Applicant: CRRC QINGDAO SIFANG CO., LTD., Qingdao (CN)

(72) Inventors: Lin Sun, Qingdao (CN); Yue Xu, Qingdao (CN); Yuming Feng, Qingdao (CN); Peng Lin, Qingdao (CN); Sansan Ding, Qingdao (CN)

(73) Assignee: CRRC QINGDAO SIFANG CO., LTD., Qingdao (CN)

( * ) Notice: Subject to any disclaimer, the term of this patent is extended or adjusted under 35 U.S.C. 154(b) by 312 days.

(21) Appl. No.: 16/765,841

(22) PCT Filed: Oct. 11, 2018

(86) PCT No.: PCT/CN2018/109844
§ 371 (c)(1),
(2) Date: Aug. 17, 2020

(87) PCT Pub. No.: WO2019/109726
PCT Pub. Date: Jun. 13, 2019

(65) Prior Publication Data
US 2021/0122940 A1 Apr. 29, 2021

(30) Foreign Application Priority Data
Dec. 8, 2017 (CN) .......................... 201711296254.2
Dec. 8, 2017 (CN) .......................... 201711299089.6

(51) Int. Cl.
*C09D 151/06* (2006.01)
*C08K 3/04* (2006.01)
*C08J 3/20* (2006.01)
*C08K 3/22* (2006.01)
*H05K 9/00* (2006.01)

(52) U.S. Cl.
CPC ............ *C09D 151/06* (2013.01); *C08J 3/203* (2013.01); *C08K 3/042* (2017.05); *C08K 3/22* (2013.01); *H05K 9/0081* (2013.01); *C08J 2379/02* (2013.01); *C08K 2003/2265* (2013.01)

(58) Field of Classification Search
CPC ........ C09D 151/06; C08K 3/042; C08K 3/22; C08K 2003/2265; C08J 3/203; C08J 2379/02; H05K 9/0081
See application file for complete search history.

(56) References Cited

FOREIGN PATENT DOCUMENTS

| CN | 102020899 A | 4/2011 |
|---|---|---|
| CN | 105648438 A | 6/2016 |
| CN | 107041113 A | 8/2017 |
| CN | 108034313 A | 5/2018 |
| CN | 108184325 A | 6/2018 |
| EP | 2835375 A1 | 2/2015 |

OTHER PUBLICATIONS

CN 105648438 machine translation (Year: 1016).*
PCT/CN2018/109844, International Search Report and Written Opinion, dated Jun. 13, 2019, 10 pages.

* cited by examiner

*Primary Examiner* — Edward J Cain
(74) *Attorney, Agent, or Firm* — Stoel Rives LLP

(57) ABSTRACT

The present invention relates to a shielding filler, a shielding coating comprising the same, a preparation method and a use thereof. The shielding filler adopts melamine sponge as a carrier and surfaces thereof are covered with $FeO_x$/graphene. The electromagnetic shielding coating is formed by mixing a component A and a component B in a molar ratio of $(-OH)_A:(-NCO)_B=1:1$, in which component A comprises fluorocarbon resin, elastic polyester resin, an electromagnetic filler, an auxiliary agent and a mixing solvent, and component B is isocyanate. The shielding filler of the present invention has a sponge-like macroporous structure, the pore wall surfaces of which are covered with ferrite and graphene, and the shielding filler has excellent electromagnetic shielding performance due to the electrical loss and magnetic loss. The obtained electromagnetic shielding coating layer is electrically conductive and magnetically inductive and has a broad electromagnetic shielding response frequency band. The obtained electromagnetic shielding coating layer has a low density, which is in line with the development trend of lightweight. The coating is convenient to use, and can be applied by brush coating, spray coating, or roller coating.

10 Claims, 2 Drawing Sheets

ELECTROMAGNETIC SHIELDING FILLER, ELECTROMAGNETIC SHIELDING COATING COMPRISING THE SAME, PREPARATION METHOD AND USE THEREOF

CROSS REFERENCE

The present application is a national phase application of International Patent Application No. PCT/CN2018/109844, filed Oct. 11, 2018, which claims the priority to the Chinese Patent Application No. 201711299089.6, entitled "Electromagnetic shielding filler, and preparation method and use thereof", filed on Dec. 8, 2017, and the Chinese Patent Application No. 201711296254.2, entitled "Electromagnetic shielding coating, and preparation method and use thereof", filed on Dec. 8, 2017, the entire disclosures of which are incorporated herein by reference in their entirety.

TECHNICAL FIELD

The present invention relates to an electromagnetic shielding filler, an electromagnetic shielding coating comprising the same, a preparation method and a use thereof, belonging to the technical field of functional materials.

BACKGROUND ART

Electromagnetic shielding coating significantly reduces the energy of incident electromagnetic waves by reflection, absorption and multiple reflection of the incident electromagnetic waves, and plays a role of electromagnetic shielding. The existing electromagnetic shielding coatings are mainly electrically conductive coatings, and the electrically conductive fillers added are generally metal powders such as gold, silver, copper, and nickel, and non-metal powders such as carbon black and graphite. Gold powder and silver powder have good electrical conductivity and chemical stability, and have been used in key electronic devices on spacecrafts, aircrafts and ships and the like, but they are expensive and have high density, which limits their use in large areas. The properties of copper powder and nickel powder are similar to that of silver, but they are easy to be oxidized, and unstable in electrical conductivity, and the durability of the formulated electromagnetic shielding coating is poor. As electrically conductive fillers, carbon black and graphite powder have good dispersibility and low price, but have poor electrical conductivity.

CN201610989480.8 discloses a preparation method of a silver-plated copper powder filler for electromagnetic shielding coatings, comprising adding ascorbic acid into a mixed copper sulfate solution to perform reaction for at least one hour to obtain a copper powder; and then, adding a silver nitrate solution into EDTA, heating to react, and reacting with the copper powder to obtain a silver-plated copper powder. The copper powder obtained by the invention has a particle diameter of 1 to 10 µm, a smooth surface, small size change after silver plating, and excellent electrical conductivity, thereby being suitable for the electromagnetic shielding coatings, but the silver-plated copper powder obtained by this method mainly plays a role of electric conduction, and has a limited response to the low-frequency magnetic field band.

CN200910272807.X discloses a preparation method of a silver-coated glass microsphere compound particle electromagnetic shielding filler, the preparation method of the novel electromagnetic shielding filler comprises the following steps: by using clean glass microspheres as templates, firstly carrying out sulfhydrylation or amination modification on the surfaces of the templates; then enabling silver nanoparticles to directionally deposit and gradually grow on the surfaces of the templates continuously by using a chemical silvering method to obtain silver-coated glass microsphere compound particles with complete nuclear shell structures; and then, dissolving the templates with a hydrofluoric acid solution, and suction filtering, washing and drying to obtain hollow silver microspheres with complete structures to be used as the electromagnetic shielding filler. The novel electromagnetic shielding filler prepared by the invention has good electrical conductivity. Compared with the traditional electrically conductive silver powder, the cost of the novel electromagnetic shielding filler is at least lowered by 65%, and the weight thereof is reduced by more than 80%. The electromagnetic shielding composite material prepared from the novel electromagnetic shielding filler has better shielding effectiveness. However, the electromagnetic shielding filler obtained by this method mainly plays a role of electric conduction, and has a limited response to the low-frequency magnetic field band, which affects the shielding application of the electromagnetic shielding coating in the magnetic field band.

CN201510873045.4 discloses a heat-conduction and electrically conductive composite material containing graphene and a preparation method and use thereof The preparation method comprises the steps of uniformly mixing a heat-conduction and electrically conductive filler formed by mixing of silver powder and the like and graphene with organic high polymer elastic materials such as vinyl silicone oil, and constructing more smooth heat-conduction and electrically conductive networks in an organic high polymer matrix by virtue of the synergistic effect of graphene with high thermal conductivity and electrical conductivity and large-particle-size fillers such as silver powder, so as to obtain an organic high polymer composite material with excellent thermal conductivity and electrical conductivity and good elasticity and flexibility. The preparation process of the composite material is simple, the thermal conductivity of the composite material can reach 12 W/mK, the electrical conductivity can reach 500 S/m, and the electromagnetic shielding property can reach 45 dB. However, the electromagnetic shielding filler obtained by this method mainly plays the role of electrical loss, and only has a shielding effect on the medium-high frequency, and has limited shielding effectiveness on the magnetic field of the low-medium frequency band.

CN201510896392.9 discloses a preparation method for an electromagnetic shielding coating layer. With non-metallic parts as application objects, using graphene and electrically conductive carbon black as functional fillers, a lightweight, long-acting and serialized electromagnetic shielding coating material based on a high-electrically conductivity graphene functional filler is prepared, the electromagnetic shielding coating layer not only can effectively enhance the electromagnetic protection capability of the equipment, but also can meet the lightweight requirement of the equipment, however, this electromagnetic shielding coating layer is mainly targeted at high frequency electromagnetic shielding. CN201010561198.2 discloses a composite coating electromagnetic shielding paint and a composite coating electromagnetic shielding material prepared therefrom. The composite coating electromagnetic shielding paint comprises an electrically conducting layer paint with a reflection function and a wave-absorbing layer paint with an absorption function. However, this electromagnetic shielding coating uses nickel powder as the electrically conductive filler, uses ordinary magnetic powder as the magnetic conductive filler, and is high in density and easy to be oxidized, thereby affecting the service life of the coating layer. CN201611243277.2 discloses a modified graphene electromagnetic shielding paint. The modified graphene electromagnetic shielding paint comprises modified graphene slurry, resin, pigment filler, auxiliaries and a solvent. The modified graphene slurry comprises modified graphene obtained by modifying graphene through a modifier, the modifier is an organic molecule with a large 7C bond conjugated structure, and the resin is acrylic resin. However, the electromagnetic shielding filler obtained by this method also mainly plays the role of electrical loss, only has a shielding effect on the medium-high frequency, and has limited shielding effectiveness on the magnetic field of the low-medium frequency band.

SUMMARY OF THE INVENTION

In order to solve the above technical problems, the present invention provides a lightweight and efficient electromagnetic shielding filler for carbon fiber composite materials, which adopts melamine sponge as a carrier and adheres $Fe(NO_3)_3$ and graphene oxide to the sponge by a solution impregnation treatment, then the sponge is subjected to heat treatment to obtain an $FeO_x$/graphene composite electromagnetic shielding filler. The filler has a sponge-like macroporous structure, the pore wall surfaces of which are covered with ferrite and graphene; and has excellent electromagnetic shielding performance due to the electrical loss and magnetic loss.

The present invention is realized by adopting the following technical solutions.

A shielding filler, which adopts melamine sponge as a carrier and surfaces thereof are covered with $FeO_x$/graphene; wherein $FeO_x$ preferably exists in the following form: one or more of Fe, FeO, $Fe_2O_3$ or $Fe_3O_4$ and the like, wherein FeO accounts for 5% to 99% of the total mass of the shielding filler, and graphene accounts for 1% to 95% of the total mass of the shielding filler. The shielding filler has a porosity of 65% to 85%, a saturation magnetization of 86 to 95 emu/g, a coercive force of 158 to 210 Oe, and a response frequency band of 100 kHz to 18 GHz.

The present invention also provides a preparation method of a shielding filler, comprising:

(1) preparing an aqueous dispersion solution of $Fe^{3+}$-graphene oxide;

(2) impregnating the melamine sponge with the $Fe^{3+}$-graphene oxide solution to adsorb the $Fe^{3+}$-graphene oxide solution, oven drying; and (3) subjecting the melamine sponge to high temperature treatment.

Step (1) specifically comprises the following steps: adding an iron salt into an aqueous dispersion solution of graphene oxide, and controlling the concentration of $Fe^{3+}$ to be 5 mg/ml to 500 mg/ml, preferably 10 to 200 mg/ml.

Wherein, the concentration of the aqueous dispersion solution of graphene oxide is 0.5 mg/ml to 5.0 mg/ml, preferably 1.0 to 5.0 mg/ml, such as 2.0 mg/ml.

Wherein, the iron salt is one or more selected from $Fe(NO_3)_3$, $FeCl_3$, $Fe_2(SO_4)_3$, and iron acetate.

In step (2), the impregnation time is 0.5 h to 5 h, preferably 2 to 5 h.

In step (2), the drying temperature is 50° C. to 150° C., preferably 80 to 110° C.

In step (3), the $Fe^{3+}$-graphene oxide/melamine sponge obtained in step (2) is heated to 300° C. to 1200° C. at a speed of 1 to 20° C./min for heat treatment, ground and sieved to obtain an $FeO_x$/graphene electromagnetic shielding filler; preferably, the heating speed is 5 to 10° C./min, and the heat treatment temperature is 500 to 800° C.

The present invention also provides the use of the shielding filler in the electromagnetic shielding material for trains, aircrafts, ships or transformers. The train preferably adopts a vehicle body made of a carbon fiber composite material.

The present invention also provides a shielding coating containing the above-mentioned shielding filler.

The present invention also provides a lightweight and efficient graphene-based electromagnetic shielding coating for rail vehicles and a preparation method thereof. By using a polyester resin with certain elasticity and fluorine-modified hydroxy acrylic resin with excellent weather resistance as the base material, adding the above ferrite/graphene composite electromagnetic shielding filler and a small amount of silver fiber as the filler, the coating layer is electrically conductive and magnetically inductive, thereby improving the electromagnetic shielding performance of the coating layer.

The present invention is realized by the following technical solutions:

an electromagnetic shielding coating, which is formed by mixing a component A and a component B in a molar ratio of $(—OH)_A:(—NCO)_B=1:1$;

wherein, the component A is prepared from the following raw materials in parts by weight: 25 to 55 parts of fluorocarbon resin, 5 to 25 parts of elastic polyester resin, 20 to 30 parts of electromagnetic shielding filler, 1.5 to 4 parts of auxiliary agent, and 5 to 10 parts of mixed solvent;

the component B is selected from isocyanate.

The fluorocarbon resin is an ethylene polymer grafted with fluorine atoms; preferably GK570, polychlorotrifluoroethylene/vinyl ether resin (FEVE). The fluorocarbon resin not only has good weather resistance, but also has the characteristics of low surface energy, which can impart good stain resistance to the coating layer.

The elastic polyester resin is an elastic polyester modified acrylic resin, and molecular formula of the elastic polyester modified acrylic resin contains irregular polyols with a high relative molecular mass and long-chain fatty acids; preferably, the elastic polyester resin is FTH elastic resin.

Preferably, the high relative molecular mass means that the relative molecular mass is greater than 2000, preferably greater than 5000.

The electromagnetic shielding filler is the lightweight and efficient electromagnetic shielding filler for the carbon fiber composite material as described above.

The auxiliary agent is one or more selected from defoaming agent, leveling agent, dispersant agent or thixotropic agent; wherein, the defoaming agent is selected from BYK-530A, BYK110 or Deuchem 6800; the leveling agent is selected from BYK-320, EFKA3777 or EFKA-2022; and the thixotropic agent is one or more selected from polyamide wax, organic bentonite or fumed silica.

The mixed solvent consists of xylene, ethyl acetate, and cyclohexanone in a mass ratio of (2.0 to 5.0):(1.5 to 4.0):(2.5 to 6.0), preferably 3.5:3:3.5.

The present invention also provides a preparation method of a shielding coating, comprising the following steps:

(1) adding the fluorocarbon resin, elastic polyester resin, and auxiliary agent into 2/3 of the mixed solvent, mixing and stirring, slowly adding the electromagnetic shielding filler, dispersing evenly, then grinding to a fineness of 40 μm, adding the remaining mixed solvent, adjusting the system viscosity to 800 to 1000 cp, filtering and discharging to obtain component A; and (2) mixing the component A and component B, and stirring uniformly to prepare the electromagnetic shielding coating.

The present invention also provides the use of the above-mentioned shielding coating in the electronic device in the fields of rail vehicles, aircrafts, ships or transformers.

The present invention also provides an electronic device comprising a coating layer prepared from the shielding coating according to any one of claims 1 to 7.

The electromagnetic shielding filler of the present invention and the electromagnetic shielding coating comprising the electromagnetic shielding filler have the following advantages:

(1) the obtained electromagnetic shielding filler and the electromagnetic shielding coating layer are electrically conductive and magnetically inductive and have a broad electromagnetic shielding response frequency band;

(2) the obtained electromagnetic shielding filler has porous characteristic, which can increase the multilayer reflection effect of electromagnetic waves;

(3) melamine sponge is used as a raw material, and waste resources can be effectively utilized;

(4) the preparation method is simple and does not require complicated processes and expensive equipment;

(5) the obtained electromagnetic shielding coating layer has a low density, which is in line with the development trend of lightweight; and (6) the obtained electromagnetic shielding coating layer is convenient to implement, and can be applied by brush coating, spray coating, or roller coating.

SPECIFIC MODES FOR CARRYING OUT THE EMBODIMENTS

Figure 1:
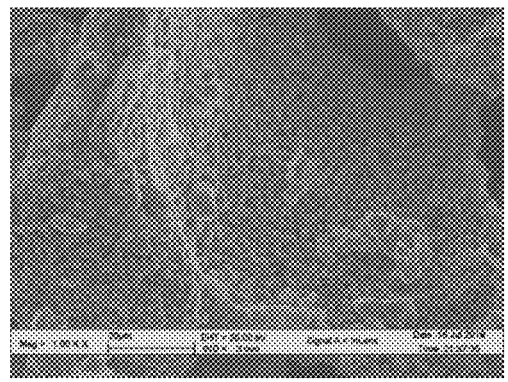
FIG. 1 is a scanning electron microscope image of the $FeO_x$/graphene electromagnetic shielding filler obtained by the present invention.
Figure 2:
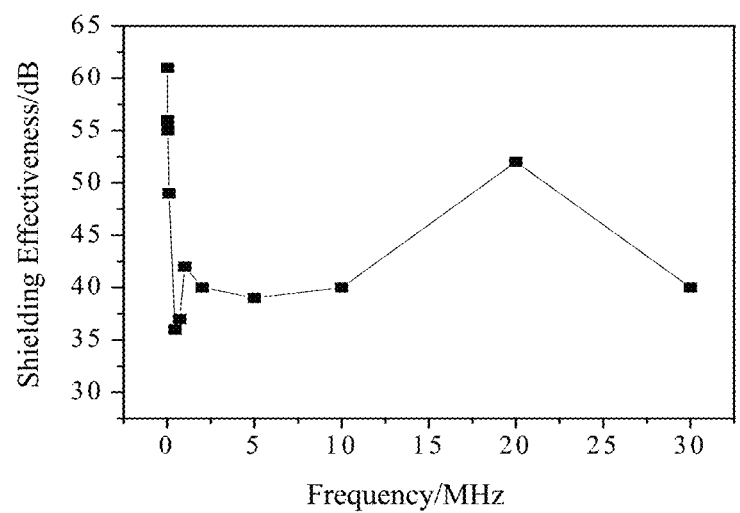
FIG. 2 is a magnetic field shielding effectiveness curve of the electromagnetic shielding coating layer of the present invention in the range of 10 kHz to 30 MHz.
Figure 3:
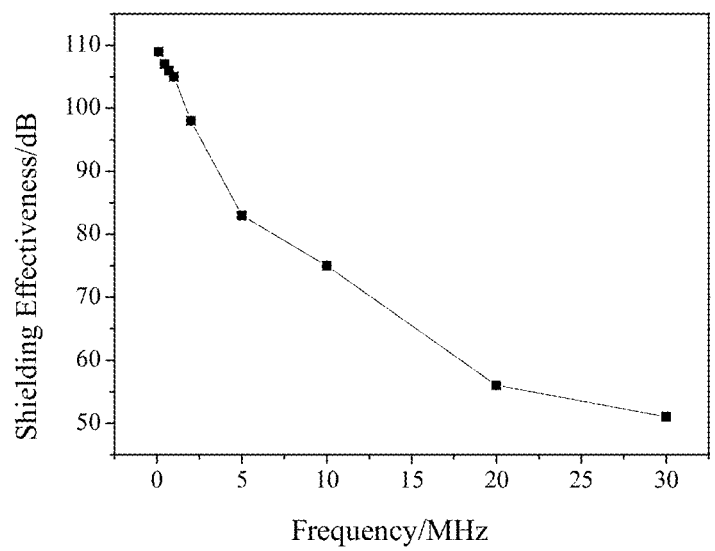
FIG. 3 is an electric field shielding effectiveness curve of the electromagnetic shielding coating layer of the present invention in the range of 10 kHz to 30 MHz.
Figure 4:
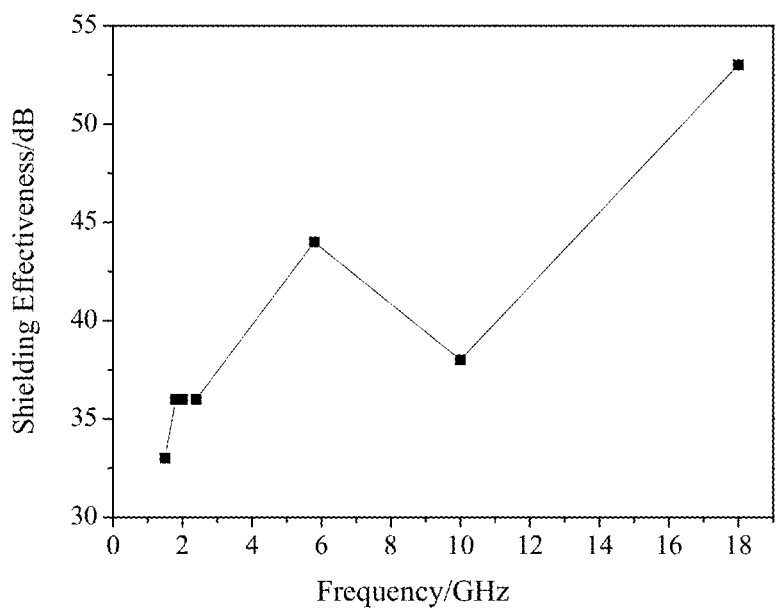
FIG. 4 is an electromagnetic field shielding effectiveness curve of the electromagnetic shielding coating layer of the present invention in the range of 10 GHz to 18 GHz.

Exemplary embodiments of the present invention are provided in the following Examples. The following embodiments are given by way of examples only, and are used to assist a person skilled in the art in using the present invention. The Examples are not intended to limit the scope of the present invention in any way.

Example 1: An $FeO_x$/Graphene Electromagnetic Shielding Filler

The present Example provides a $FeO_x$/graphene electromagnetic shielding filler, which was prepared by the following method:

(1) An aqueous dispersion solution of $Fe(NO_3)_3$-graphene oxide was prepared.

$Fe(NO_3)_3$ was added into an aqueous dispersion solution of graphene oxide at a concentration of 5 mg/ml to prepare an aqueous dispersion solution of $Fe(NO_3)_3$ with a concentration of 10 mg/ml.

(2) Melamine sponge was impregnated and the $Fe(NO_3)_3$-graphene oxide solution was adsorbed.

The melamine sponge was impregnated in the aqueous dispersion solution of $Fe(NO_3)_3$-graphene oxide obtained in the above step (1) for 2 h, then taken out and dried at 110° C. for 12 h.

(3) A lightweight and efficient $FeO_x$/graphene electromagnetic shielding filler was prepared by high temperature treatment.

The dried $Fe(NO_3)_3$-graphene oxide/melamine sponge was placed into a tubular furnace, heated up to 600° C. at the rate of 10° C./min and subjected to heat treatment for 3 h, then ground and sieved to obtain an $FeO_x$/graphite electromagnetic shielding filler.

After testing, the obtained shielding filler has a porosity of 85%, a saturation magnetization of 95 emu/g, a coercive force of 210 Oe, and an electromagnetic shielding response frequency band of 100 kHz to 18 GHz.

Example 2: A $FeO_x$/Graphene Electromagnetic Shielding Filler

The present Example provides a $FeO_x$/graphene electromagnetic shielding filler, which was prepared by the following method:

(1) An aqueous dispersion solution of $FeCl_3$-graphene oxide was prepared.

$FeCl_3$ was added into an aqueous dispersion solution of graphene oxide at a concentration of 1.0 mg/ml to prepare an aqueous dispersion solution of $FeCl_3$ with a concentration of 100 mg/ml.

(2) Melamine sponge was impregnated and the $FeCl_3$-graphene oxide solution was adsorbed.

The melamine sponge was impregnated in the aqueous dispersion solution of $FeCl_3$-graphene oxide obtained in the above step (1) for 3 h, then taken out and dried at 100° C. for 20 h.

(3) A lightweight and efficient $FeO_x$/graphene electromagnetic shielding filler was prepared by high temperature treatment.

The dried $FeCl_3$-graphene oxide/melamine sponge was placed into a tubular furnace, heated up to 500° C. at the rate of 5° C./min and subjected to heat treatment for 4 h, then ground and sieved to obtain an $FeO_x$/graphite electromagnetic shielding filler.

After testing, the obtained shielding filler has a porosity of 65%, a saturation magnetization of 86 emu/g, a coercive force of 200 Oe, and an electromagnetic shielding response frequency band of 100 kHz to 18 GHz.

Example 3: A $FeO_x$/Graphene Electromagnetic Shielding Filler

The present Example provides a $FeO_x$/graphene electromagnetic shielding filler, which was prepared by the following method:

(1) An aqueous dispersion solution of $Fe(SO_4)_3$-graphene oxide was prepared.

$Fe(SO_4)_3$ was added into an aqueous dispersion solution of graphene oxide at a concentration of 2 mg/ml to prepare an aqueous dispersion solution of $Fe(SO_4)_3$ with a concentration of 200 mg/ml.

(2) Melamine sponge was impregnated and the Fe(SO$_4$)$_3$-graphene oxide solution was adsorbed.

The melamine sponge was impregnated in the aqueous dispersion solution of Fe(SO$_4$)$_3$-graphene oxide obtained in the above step (1) for 5 h, then taken out and dried at 80° C. for 16 h.

(3) A lightweight and efficient FeO$_x$/graphene electromagnetic shielding filler was prepared by high temperature treatment.

The dried Fe(SO$_4$)$_3$-graphene oxide/melamine sponge was placed into a tubular furnace, heated up to 800° C. at the rate of 10° C./min and subjected to heat treatment for 5 h, then ground and sieved to obtain an FeO$_x$/graphite electromagnetic shielding filler.

After testing, the obtained shielding filler has a porosity of 78%, a saturation magnetization of 88 emu/g, a coercive force of 158 Oe, and an electromagnetic shielding response frequency band of 100 kHz to 18 GHz.

Example 4: Preparation of an Electromagnetic Shielding Coating

The present Example provides a method for preparing a shielding coating, comprising the following steps:

(1) 30 g of GK570 fluorocarbon resin, 15 g of FTH elastic polyester resin, 0.5 g of Deuchem 6800 auxiliary agent, 0.5 g of BYK110 auxiliary agent, 0.5 g of EFKA2020 auxiliary agent, and 0.5 g of EFKA3777 auxiliary agent were added into 7 g of mixed solvent, the resultant was mixed and stirred, 30 g of the electromagnetic shielding filler obtained in Example 1 was slowly added, and dispersed evenly, then the resultant was grinded to a fineness of 40 μm, and the remaining 3 g of mixed solvent was added, the system viscosity was adjusted to 800 to 1000 cp, and the resultant was filtered and discharged to obtain component A;

the mixed solvent consists of 3.5 g of xylene, 3 g of ethyl acetate, and 3.5 g of cyclohexanone; and (2) component A and component B (isocyanate N3390) was mixed in a molar ratio of (—OH)$_A$:(—NCO)$_B$=1:1, and stirred uniformly to prepare an electromagnetic shielding coating.

Example 5

The present Example provides a preparation method of a shielding coating, which is similar to Example 4 except that the formulation of component A was as follows:

25 g of GK570 fluorocarbon resin, 25 g of FTH elastic polyester resin, 0.3 g of 6800 auxiliary agent, 0.6 g of BYK110 auxiliary agent, 0.3 g of EFKA2020 auxiliary agent, 0.6 g of EFKA3777 auxiliary agent, 5 g of mixed solvent, and 20 g of electromagnetic shielding filler.

Example 6

The present Example provides a preparation method of a shielding coating, which is similar to Example 4 except that the formulation of component A was as follows:

55 g of GK570 fluorocarbon resin, 5 g of FTH elastic polyester resin, 0.6 g of 6800 auxiliary agent, 0.3 g of BYK110 auxiliary agent, 0.6 g of EFKA2020 auxiliary agent, 0.4 g of EFKA3777 auxiliary agent, 8 g of mixed solvent, and 25 g of electromagnetic shielding filler.

Effect Verification

The performances of the shielding coating obtained in Examples 4-6 were tested, and the results were as follows:

| Coating layer | Resistivity/Ω · cm | Saturation magnetization/emu/g | Response frequency band | Density of the coating layer/g/m$^3$ |
|---|---|---|---|---|
| Example 4 | 0.05 | 78 | 10 KHz to 18 GHz | 1.8 |
| Example 5 | 2.0 | 21 | 10 KHz to 18 GHz | 1.3 |
| Example 6 | 0.4 | 54 | 10 KHz to 18 GHz | 1.6 |

Although the present invention has been described in detail with the general description and specific embodiments, it is obvious to a person skilled in the art that some modifications or improvements can be made on the basis of the present invention. Therefore, these modifications or improvements made without departing from the spirit of the present invention all belong to the claimed scope of the present invention.

INDUSTRIAL APPLICABILITY

The present invention provides a shielding filler, a shielding coating comprising the same, a preparation method and a use thereof. The shielding filler according to the present invention adopts melamine sponge as a carrier and surfaces thereof are covered with FeO$_x$/graphene; wherein FeO$_x$ preferably exists in the following form: one or more of Fe, FeO, Fe$_2$O$_3$ or Fe$_3$O$_4$; the FeO$_x$ accounts for 5% to 99% of the total mass of the shielding filler, and graphene accounts for 1% to 95% of the total mass of the shielding filler. The shielding coating is formed by mixing a component A and a component B in a molar ratio of (—OH)$_A$:(—NCO)$_B$=1:1; wherein the component A is prepared from the following raw materials in parts by weight: 25 to 55 parts of fluorocarbon resin, 5 to 25 parts of elastic polyester resin, 20 to 30 parts of electromagnetic shielding filler, 1.5 to 4 parts of auxiliary agent and 5 to 10 parts of mixed solvent; and the component B is isocyanate. The shielding filler of the present invention has a sponge-like macroporous structure, the pore wall surfaces of which are covered with ferrite and graphene; and the shielding filler has excellent electromagnetic shielding performance due to the electrical loss and magnetic loss. The obtained electromagnetic shielding coating layer is electrically conductive and magnetically inductive and has a broad electromagnetic shielding response frequency band. The obtained electromagnetic shielding coating layer has a low density, which is in line with the development trend of lightweight. The coating is convenient to use, and can be applied by brush coating, spray coating, or roller coating, with good economic value and application prospects.

What is claimed is:

1. A shielding filler, wherein, the shielding filler adopts melamine sponge as a carrier and surfaces thereof are covered with FeO$_x$/graphene;
   wherein, the FeO$_x$ exists in the following forms: one or more of Fe, FeO, Fe$_2$O$_3$ or Fe$_3$O$_4$;
   the FeO$_x$ accounts for 5% to 99% of the total mass of the shielding filler, and the graphene accounts for 1% to 95% of the total mass of the shielding filler.

2. The shielding filler according to claim 1, wherein, the shielding filler has a porosity of 65% to 85%, a saturation magnetization of 86 to 95 emu/g, a coercive force of 158 to 210 Oe, and a response frequency band of 100 kHz to 18 GHz.

3. A preparation method of a shielding filler, wherein, the method comprises the following steps:
   (1) preparing an aqueous dispersion solution of Fe$^{3+}$-graphene oxide;

(2) impregnating the melamine sponge with the $Fe^{3+}$-graphene oxide solution to adsorb the $Fe^{3+}$-graphene oxide solution, oven drying; and (3) subjecting the melamine sponge to high temperature treatment;

preferably, step (1) specifically comprises the following steps: adding an iron salt into an aqueous dispersion solution of graphene oxide, and controlling the concentration of $Fe^{3+}$ to be 5 mg/ml to 500 mg/ml;

and/or, the concentration of the aqueous dispersion solution of graphene oxide is 0.5 mg/ml to 5 mg/ml, preferably 1.0 to 5.0 mg/ml;

and/or, the iron salt is one or more selected from $Fe(NO_3)_3$, $FeCl_3$, $Fe_2(SO_4)_3$, and iron acetate;

preferably, in step (3), the $Fe^{3+}$-graphene oxide/melamine sponge obtained in step (2) is heated to 300° C. to 1200° C. for heat treatment, ground and sieved to obtain an $FeO_x$/graphene electromagnetic shielding filler; the heat treatment temperature is preferably 500 to 800° C.;

and/or, the heating rate is 1 to 20° C./min, more preferably 5 to 10° C./min.

4. A preparation method of electromagnetic shielding material for trains, aircrafts, ships or transformers, wherein the method comprises: using the shielding filler according to claim 1.

5. A shielding coating, which is formed by mixing a component A and a component B in a molar ratio of $(—OH)_A:(—NCO)_B=1:1$, wherein, the component A is prepared from the following raw materials in parts by weight: 25 to 55 parts of fluorocarbon resin, 5 to 25 parts of elastic polyester resin, 20 to 30 parts of the shielding filler according to claim 1, 1.5 to 4 parts of auxiliary agent, and 5 to 10 parts of mixed solvent; and the component B is isocyanate.

6. The shielding coating according to claim 5, wherein, the fluorocarbon resin is an ethylene polymer grafted with fluorine atoms; preferably GK570, polychlorotrifluoroethylene/vinyl ether resin (FEVE);

and/or, the elastic polyester resin is an elastic polyester modified acrylic resin, and molecular formula of the elastic polyester modified acrylic resin contains irregular polyols with a high relative molecular mass and long-chain fatty acids; preferably, the elastic polyester resin is FTH elastic resin.

7. The shielding coating according to claim 5, wherein, the auxiliary agent is one or more selected from defoaming agent, leveling agent, dispersant agent or thixotropic agent;

preferably, the defoaming agent is selected from BYK-530A, BYK110 or Deuchem 6800;

and/or, the leveling agent is selected from BYK-320, EFKA3777 or EFKA-2022;

and/or, the thixotropic agent is one or more selected from polyamide wax, organic bentonite or fumed silica;

and/or, the mixed solvent consists of xylene, ethyl acetate, and cyclohexanone in a mass ratio of (2.0 to 5.0):(1.5 to 4.0):(2.5 to 6.0).

8. The preparation method of the shielding coating according to claim 5, wherein, the method comprises the following steps:

(1) adding the fluorocarbon resin, elastic polyester resin, and auxiliary agent into 2/3 of the mixed solvent, mixing and stirring, slowly adding the electromagnetic shielding filler, dispersing evenly, then grinding to a fineness of 40 μm, adding the remaining mixed solvent, adjusting the system viscosity to 800 to 1000 cp, filtering and discharging to obtain component A; and (2) mixing the component A and component B, and stirring uniformly to prepare the electromagnetic shielding coating.

9. A preparation method of an electronic device in the fields of rail vehicles, aircrafts, ships or transformers, wherein the method comprises: using the shielding coating according to claim 5.

10. An electronic device, wherein, the electronic device comprises the coating layer prepared from the shielding coating according to claim 5.

* * * * *